United States Patent
Edwards et al.

(10) Patent No.: US 8,643,165 B2
(45) Date of Patent: Feb. 4, 2014

(54) SEMICONDUCTOR DEVICE HAVING AGGLOMERATE TERMINALS

(75) Inventors: Darvin R. Edwards, Garland, TX (US); Siva Prakash Gurrum, Dallas, TX (US); Masood Murtuza, Sugar Land, TX (US); Matthew D. Romig, Richardson, TX (US); Kazunori Hayata, Beppu-Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 9 days.

(21) Appl. No.: 13/351,579

(22) Filed: Jan. 17, 2012

(65) Prior Publication Data

US 2012/0211889 A1 Aug. 23, 2012

Related U.S. Application Data

(60) Provisional application No. 61/445,630, filed on Feb. 23, 2011.

(51) Int. Cl.
| | | |
|---|---|---|
| *H01L 23/52* | (2006.01) | |
| *H01L 23/48* | (2006.01) | |
| *H01L 23/04* | (2006.01) | |
| *H01L 23/14* | (2006.01) | |
| *H01L 23/06* | (2006.01) | |

(52) U.S. Cl.
USPC ........... 257/690; 257/692; 257/698; 257/702; 257/729

(58) Field of Classification Search
USPC .......................... 257/690, 692, 698, 702, 729
See application file for complete search history.

(56) References Cited

U.S. PATENT DOCUMENTS

| | | | |
|---|---|---|---|
| 6,940,156 B2 * | 9/2005 | Bauer et al. ................... | 257/678 |
| 7,476,981 B2 | 1/2009 | Bergmann et al. | |
| 7,816,780 B2 | 10/2010 | Kajiwara et al. | |
| 7,836,586 B2 | 11/2010 | Bayan et al. | |
| 7,955,901 B2 * | 6/2011 | Ewe et al. ..................... | 438/123 |
| 2004/0245648 A1 | 12/2004 | Nagasawa et al. | |
| 2010/0055839 A1 | 3/2010 | Nikitin | |
| 2010/0155934 A1 * | 6/2010 | Yim et al. ..................... | 257/704 |

FOREIGN PATENT DOCUMENTS

| | | |
|---|---|---|
| EP | 1626614 A1 | 2/2004 |
| EP | 1666175 A1 | 7/2006 |
| EP | 1780732 A1 | 2/2007 |
| WO | 0235554 | 5/2002 |

OTHER PUBLICATIONS

National Semiconductor Corporation U.S. Appl. No. 12/133,335, filed Jun. 4, 2008; Will Wong et al.
Philip Rogren et al.; A High Performance and Cost Effective Molded Array Package Substrate.

* cited by examiner

*Primary Examiner* — Ngan Ngo
(74) *Attorney, Agent, or Firm* — Steven A. Shaw; Wade James Brady, III; Frederick J. Telecky, Jr.

(57) ABSTRACT

A plastic package (100) in which a semiconductor chip (101) is adhesively (102) attached to a metal stripe (110a) having an agglomerate structure, and electrically connected to bondable and solderable metal stripes (120) having particulate structures; metal stripes (120) are touching metal stripes (110b) of agglomerate structure to form vertical stacks (150); coats of solder (140) are welded to the agglomerate metal stripes (100a and 110b).

2 Claims, 3 Drawing Sheets

SEMICONDUCTOR DEVICE HAVING AGGLOMERATE TERMINALS

FIELD OF THE INVENTION

The present invention is related in general to the field of semiconductor devices and processes, and more specifically to the structure and fabrication method of agglomerate terminals for semiconductor packages, which allow reliable contacts by soldering and bonding.

DESCRIPTION OF RELATED ART

Semiconductor devices use predominantly metal to communicate among components such as transistors within a semiconductor chip and between a semiconductor chip and external implements such as a printed circuit board (PCB). Within the semiconductor chip, metal lines and interconnects can be formed by depositing a sputtered, evaporated, and plated metal film such as copper, aluminum, titanium and tungsten and by patterning the deposited metal into the desired electrical elements, including using photolithography, etching and chemical-mechanical polishing (CMP) techniques.

Between the semiconductor chip and the PCB, communication is through another metallic structure commonly called the leadframe. Leadframes are formed from metal sheets such as copper, aluminum, and iron-nickel alloys that are stamped or etched into chip pads on which semiconductor chips are attached and desired lead configurations. Copper or gold wires connect the chip terminals electrically to leadframe leads.

Although the metallic components mentioned above may be made of various metallic elements, a common feature among them is their polycrystalline structure characterized by grains of metal of various sizes and orientations separated by clear grain boundaries. The grainy structure extends throughout the metal trace, line, plugs, leads, and chip pads. No voids exist among the grains.

In order to protect the assembled semiconductor chip and the bond wires from environmental and handling hazards, the chip and the bond wires along with a portion of the leadframe are usually encapsulated in a plastic package. Certain portions of the leadframe leads are exposed from the plastic housing to be connected to the PCBs by solder joints. The solder material is usually a metallic alloy and can be applied to the package of the PCB by printing or electrolytic plating.

Solder printing involves using a stencil and squeegee to apply on a work surface a paste of solder particles suspended in a liquid. This is followed by reflowing the paste at a temperature above the melting point of the solder particles to melt the solder particles into a liquid state. Upon cooling, the solder takes on a solid form, physically and electrically connecting the semiconductor device package to the PCB. Even solders, in their solid form, consist of a homogeneous mixture of intermetallic compounds and constituent metals in polycrystalline form, especially after multiple reflow processes. Solder bodies normally contain no or only minimal voiding, when processed under proper temperature and environmental conditions.

Semiconductor device packages using a leadframe are generally more cost effective compared to packages using dielectric substrates. Even so, the cost of leadframes is still a major contributor of the package's total bill of materials. Recently, fabrication processes for semiconductor packages have been proposed which eliminate the relatively costly leadframe and replace it by a more cost effective substitute.

The process comprises the step of applying a paste of metallic particles and a liquid on a carrier board to form short, lead-like stripes. This step is followed by sintering the metallic particles within each stripe at a temperature below the melting temperature of the metallic particle. Even though the particles remain in their solid state, they coalesce to grow into contiguous solid regions forming metallic structures suitable for replacing traditional lead frames and for the process of thermosonic wire bonding using gold or copper. As an example, silver powders in organic suspension vehicles have been used to be fired in controlled atmosphere at temperatures between 250 and 400° C. to create surfaces suitable for high yield wire bonding. During firing, the suspension vehicle materials burn away, leaving no ash, and the silver sinters to a high density metal mass. The carrier board may be stainless steel which peels away easily after molding leaving a surface that is clean and ready for soldering.

SUMMARY OF THE INVENTION

When molded semiconductor packages with sintered metal terminals as replacements for a conventional leadframe are to be employed as leadless devices, such as Quad Flat-pack No-lead (QFN) or Small Outline No-lead (SON) devices, the terminals have to be suitable for bonding wires on the inside of the package and for attaching solder on the outside of the package. Applicants investigated a variety of processes for attaching solder joints to metallic structures formed by sintering metal powders and encountered initially numerous problems. When the metal structures were made of silver, solder bumps containing either traditional solder or lead-free alloys had a strong tendency to dissolve so much silver that the bumps frequently contacted the molded plastic. The contacts were mechanically lose and failed strength and reliability tests. When the metal structures were made of copper, the copper surfaces oxidized so quickly after peeling away the carrier board that the solder bumps could not properly wet the copper structures and the resulting solder joints were weak and unreliable.

Applicants solved the problem of forming reliable bonding and solder contacts on sintered metal structures used as semiconductor package terminals for replacing conventional leadframes, when they discovered a metal multi-layer structure comprising a sintered agglomerate metal layer of micrometer-sized and nanometer-sized metal particles sandwiched between a top layer and a bottom layer of sintered nanometer-sized particles of a bondable and solderable metal. Preferred selections for the agglomerate metal include copper and for the bondable and solderable metal include silver. Preferred selections of low-cost and self-patterning metal deposition techniques include ink-jetting, screen-printing and stencil-printing.

In a preferred embodiment, the agglomerate layer of about 30 to 40 µm thickness is sintered of copper micro- and nano-particles, and the top layer and bottom layer of about 1 to 6 µm thickness are sintered of silver nano-particles. The top silver layer facilitates reliable bonds of copper wires to connect to an assembled semiconductor chip, and the bottom silver layer is dissolved when a solder coat, deposited on the bottom layer, is reflowed for forming reliable solder joints to the agglomerate copper layer.

Another embodiment of the invention is a high-yield low-cost method for fabricating the sintered terminals of a plastic semiconductor package, replacing the conventional leadframe. After selecting a reusable carrier board such as a foil made of stainless steel or Alloy 42, a first set of pads and a second set of pads of a paste including silver nano-particles are ink-jetted onto the foil. The deposition is followed by sintering the nano-particles at a temperature between about 250 and 400° C. into a solid silver layer of a thickness between about 1 and 6 µm. In the next process step, a mask is aligned with the pads of sintered silver nano-particles. On top of the silver pads, a paste including a mixture of copper micro-particles and nano-particles is screen-printed on the first set of pads and the second set of pads. The deposition is followed by sintering the micro- and nano-particles at a temperature between about 250 and 400° C. into an agglomerate copper layer of a thickness between about 30 and 40 µm. On top of the agglomerate copper layer of the first set of pads, a second layer of silver nano-particles is ink-jetted and sintered (layer thickness about 1 to 6 µm), completing the multi-layer stacks of the terminals of the package-to-be.

Using an adhesive polymer, semiconductor chips are then attached onto the agglomerate copper of the second set of pads. The chips are electrically connected to respective second silver layers of the first set of pads using copper bonding wires. Chips, wire bonds, and metal layer stacks are encapsulated in a polymeric compound, which is polymerized to create a hardened board of assembled chips. The carrier foil is separated from the assembled structure (by peeling, pushing, or twisting) and may be re-used.

When a solder alloy is coated onto the exposed silver terminals and reflowed, the silver of the sintered layers of the first and second pad sets is fully dissolved into the solder, eliminating any risk of silver migration. The solder is thus enabled to establish flawless wetting of the aggregate copper layers and create reliable solder joints to the package terminals.

Finally, the hardened board can be sawed to form singulated semiconductor device packages, ready to be soldered onto external PCBs.

BRIEF DESCRIPTION OF THE DRAWINGS

FIG. 3 shows the step of selecting a carrier.

FIG. 4 illustrates the step of ink-jetting and sintering patterned first metal layers with particulate structure of bondable and solderable metal on the carrier, a set of first pads surrounding a second pad.

FIG. 5 depicts the step of screening mask-patterned metal layers with agglomerate structure on the first layers of particulate structure.

FIG. 6 shows the step of ink-jetting and sintering patterned second metal layers with particulate structure of bondable and solderable metal on the layers with agglomerate structure of the first pads.

FIG. 7 illustrates the step of adhesively attaching a semiconductor chip onto the agglomerate metal layer of the second pad.

FIG. 8 depicts the step of electrically connecting the chip by bonding wires to particulate metal layers of the first pads.

FIG. 9 shows the step of encapsulating chip and wires in a polymeric compound.

FIG. 10 illustrates the step of separating the carrier from the first layers with particulate structure and the polymeric compound.

DETAILED DESCRIPTION OF THE PREFERRED EMBODIMENTS

Figure 1:
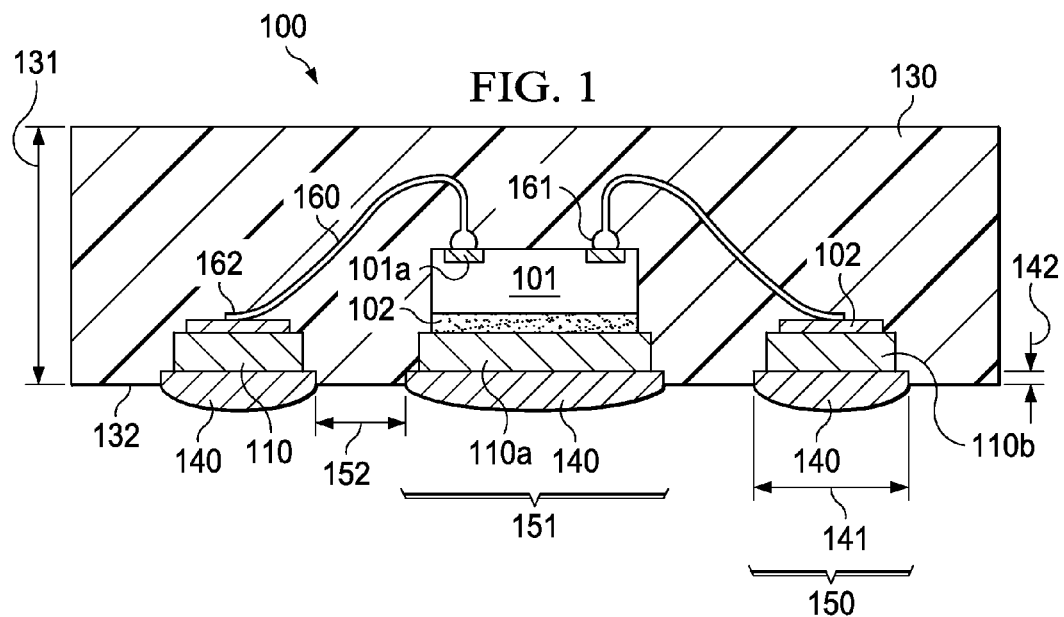
FIG. 1 shows a schematic cross section of a plastic packaged semiconductor device with sintered multi-layer metal terminals having agglomerate and particulate structures, the terminals suitable for bonding and solder-coating.

FIG. 1 shows a packaged semiconductor device generally designated 100 as an exemplary embodiment of the invention. A plastic package 130 houses a semiconductor chip 101, which employs an adhesive layer 102 to be attached (by high molecular forces) to a metal stripe 110a. The structure of stripe 110a is an agglomerate structure; alternatively, stripe 110a may have a predominantly particulate structure. Chip 101 has terminals (bond pads) 101a and is electrically connected to bondable and solderable metal stripes 120. Stripes 120 have preferably a particulate structure; alternatively, stripes 120 may have agglomerate structure.

A used herein, a stripe is an elongated band of material differing in material from the surrounding area; its outlines may be linear or irregular; its thickness may be substantially constant across its lateral dimensions, or may include tapering portions; in its characteristics, a stripe is equivalent to a layer.

The package of exemplary device 100, as formed by plastic compound 130, has preferably a cuboid outline with flat surfaces. The thickness 131 of the package formed by plastic compound 130 may be in the range from about 0.5 to 1.0 mm. The flat surface of the cuboid, which includes the device terminals, is designated 132 in FIG. 1. In preferred embodiments, a plurality of first terminals 150 surrounds a second terminal 151. The length of first terminals 150 is preferably in the range from about 0.1 to 0.3 mm, the length of second terminal 151 is preferably in the range from about 0.5 to 2.0 mm, but may be greater or smaller. First terminals 150 are spaced by gaps 152 from the second terminal 151.

As used herein, an agglomerate structure indicates a clustered composition of particles of various sizes, which has been achieved by a sintering step. Stripe 110a is a solid layer of micrometer-sized metal particles sintered with nanometer-sized particles preferably of the same metal. An illustration of a sintered stripe of agglomerate structure is reproduced in the cross section of FIG. 2 at 625× magnification. As examples, the metal may be selected from a group including copper, silver, zinc, nickel, indium, cadmium, cobalt, rhodium, high-temperature solders, and metal-filled adhesives; the preferred choice is copper. Stripes 110b comprise the same metal and the same agglomerate structure as stripe 110a, since stripes 110b are fabricated in the same process step (see below).

As further used herein, a particulate structure indicates a composition of small, separate particles, which has been achieved by a sintering step. Bondable and solderable metal stripes 120 are solid layers of sintered nanometer-sized particles. As examples, the bondable and solderable metal may be selected from a group including silver, gold, nickel, and palladium; the preferred choice is silver.

In other embodiments, layer 120 may be thicker and may have agglomerate structure made by sintering micrometer-sized metal particles with nanometer-sized metal particles.

FIG. 1 shows that the bondable and solderable metal stripes 120 of particulate structure are touching first-metal stripes designated 110b of agglomerate structure so that the metal stripes 120 are on top of the agglomerate metal stripes 110b and stripes 120 and 110b form vertical stacks of metal layers. Consequently, first terminals 150 comprise vertical multi-layer metal stacks.

FIG. 1 depicts coats of solder 140, which are welded to stripes 110a and 110b at the stripe surfaces opposite to chip 101 and metal stripes 120, respectively. The external surfaces of the solder coats display convex contours as determined by surface tension of the liquid solder alloy during the reflow process for welding the solder to stripes 110a and 110b. In addition to the starting metal alloy of the solder, coats 140 include a solderable metal in their matrix. Whatever the starting composition of the solder alloy, after entering the liquid phase in the attachment process flow, the solder alloy dissolves, either partially or completely, a solderable metal stripe originally deposited and sintered as the basis for the stripes of agglomerate structure. By this process, the solder alloy reliably forms intimate welded contacts to the stripes of agglomerate structure.

As remnants of the dissolved solderable metal stripes, flat surface 132 shows indents with the dimensions and depth of the original solderable metal stripes. Each terminal of FIG. 1 has an indent. As an example, FIG. 1 indicates an indent of a first terminal 150 with the designations 141 as indent length and 142 as indent depth (detail below in process description).

Device 100 of FIG. 1 has chip 101 electrically connected to the first terminals by wire bonds 160. Preferred bonding wires are made of copper or copper alloy; alternatively, they may be made of gold or aluminum or their alloys. When ball bonding technology is used, the ball bonds 161 are preferably attached to the chip, while the stitch bonds 162 to the second-metal stripes 120 (for instance silver) contact the first terminals 150 (see FIG. 2). Alternatively, wedge bonding may be employed. Another alternative interconnection method includes flip-chip bonding using metal bumps or studs made of a metal with strong connection to stripes 120; examples for metals of the bumps include solder and copper. As mentioned, stripes 120 are preferably sintered silver layers with particulate, or agglomerate, structure; silver is known to be eminently bondable.

Encapsulation compound 130 of device 100 protects chip 101, bonding wires 160, first metal stripes 110a and 110b, and second metal stripes 120, and it fills the gaps 152 between first terminals 150 and second terminal 151, forming flat surface 132 on the package side with the terminals. The preferred material is a thermoset molding compound suitable for transfer molding, such as an epoxy-based compound with inorganic fillers.

Figure 2:
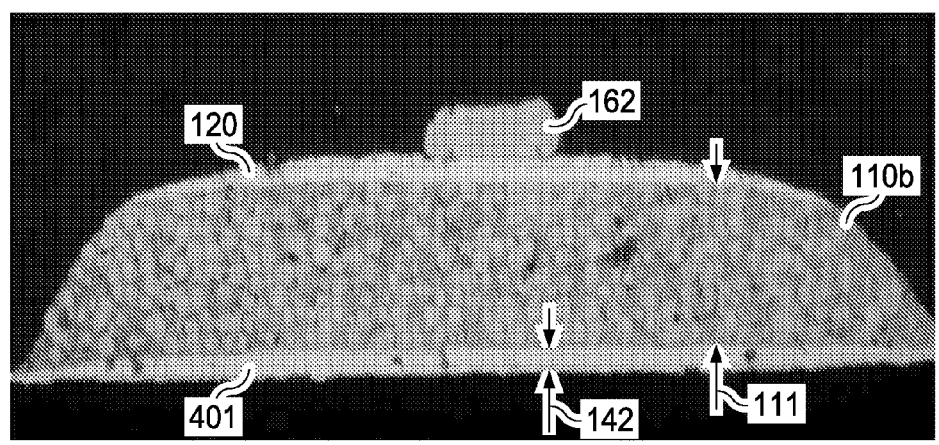
FIG. 2 shows a magnified micro-photograph of a package terminal including a stack of sintered metal layers with agglomerate and particulate structure.
Figure 3:
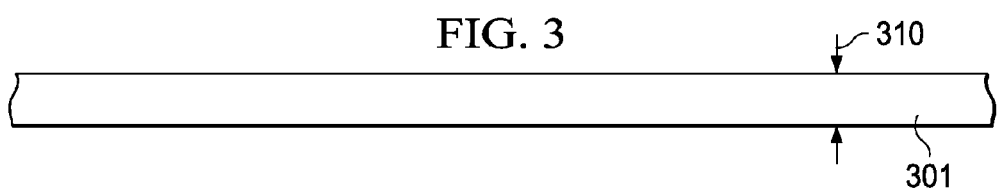
FIGS. 3 to 10 illustrate certain steps of the process flow for fabricating a semiconductor device with vertically stacked metal structures including sintered agglomerate layers of micro-particles and nano-particles.
Figure 4:
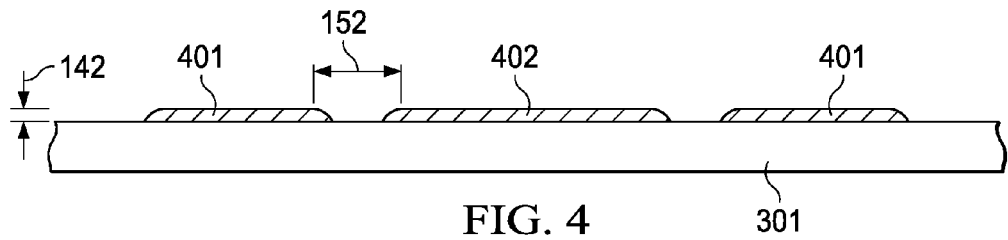

FIG. 2 is a cross section, viewed at high magnification (625×), of an exemplary first terminal 150 after attaching a stitch bond 162, but before attaching a solder coat. The agglomerate metal stripe 110b is made of sintered copper, has a thickness 111 of about 40 µm for most of its lateral extension, and clearly shows an agglomerate structure. In other embodiments, thickness 111 may be between about 20 and 200 µm. FIG. 2 depicts a plurality of copper particles having a diameter between about 2 and 7 µm, with the majority of particles about 5 µm diameter, clustered together by nanometer-size copper particles in a sintering process (at 250 to 400° C. for 30 to 60 min, see process flow below). Due to the mixture of micrometer-sized particles and nanometer-sized particles, the resulting metal structure is sometimes referred to as hybrid structure. Other particle size distributions outside of those depicted here are also capable of forming metal stripe 110b. Scattered throughout the agglomerate or hybrid structure, occasional small voids of various diameters may be observed; however, these voids do not form continuous chains of openings, stretching for instance through thickness 111. On the top and bottom surfaces of the copper stripe 110b are silver stripes 120 and 401 of particular structure (including an occasional void). The stripes have a thickness 142 of about 5 µm; in other embodiments, thickness 142 may be between about 1 and 7 µm. The silver stripes of particular structure are formed from nanometer-sized silver particles sintered together in a process of about 250 to 400° C. for 30 to 60 min (see process flow below).

Another embodiment of the invention is a method for fabricating a semiconductor device without a conventional leadframe. Significant process steps of an exemplary implementation of the method are depicted in FIGS. 3 to 10. The first step of the process, displayed in FIG. 3, involves securing a suitable carrier 301 of thickness 310. Carrier 301 should be made of a re-usable substrate material that provides a stable platform for high temperature (between 400 and 500° C.) processing and molding, but at the same time is non-adhesive to the metals and polymeric compounds used. The carrier material should only have low intermolecular forces to the metals and polymeric compounds of the product; the carrier material should not be porous and provide only temporary bonds which can be broken. The carrier material may even be coated with a mold release agent to facilitate removal of the final product. As a consequence, a lift-off of the final product is possible and the carrier can be re-used. Preferred materials include, but are not limited to, teflon, polyimide, stainless steel, copper, chromium-plated copper, nickel-plated copper, and iron-nickel alloy such as Alloy42™. Thickness 310 depends on the selected material; as an example, for Alloy42 thickness 310 may be 0.25 mm; in this case, carrier 301 resembles a foil. In other embodiments, however, carrier 301 may be thicker and thus resemble a board.

In the next steps of the process flow, a conductive pattern, which operates as the exposed leads of a package, is deposited on the carrier. In the process step shown in FIG. 4, a first patterned metal layer of thickness 142 is deposited on the selected carrier 301; the pattern includes conductive stripes 401 and 402. The preferred deposited material is a paste of nanometer-sized metal particles mixed in a liquid; such particles are herein referred to as nano-particles. Alternatively, the paste may be a mixture of micrometer-sized and nanometer-sized particles, sometimes referred to as a hybrid mixture (it results in a predominantly agglomerate structure). The metal needs to be bondable and solderable and is selected from a group including silver, gold, nickel, and palladium; the preferred metal is silver. The method of depositing is selected from a group including inkjetting, stencil printing, screen printing, and needle dispensing; the preferred method for this step is inkjetting, since it may produce flatter stripe surfaces with <3 µm roughness. The selected technique allows the deposited paste to be patterned into first pads 401 and second pads 402 so that a set of first pads 401 surrounds each second pad 402. Since the paste should result in pads with predominantly flat surface, the liquid of the paste preferably has low internal adhesion. First pads 401 are spaced from the second pad 402 by gaps 152. In the exemplary embodiment shown in FIG. 4, second pad 402 has greater lateral dimensions than first pads 401, but in other embodiments the dimensions may be equal, or pad 402 may be smaller than pads 401.

Alternatively, the paste may include micrometer-sized particles as well as nanometer-sized particles so that the resulting layer will have the characteristic of an agglomerate structure.

After the deposition, the metal nano-particles, for example silver nano-particles, are sintered at a temperature below the melting temperature of the metal element, preferably between 250 and 400° C. for about 30 to 60 min. By sintering, the metal particles adhere to each other and coalesce into a solid metal body. The resulting sintered pad, for instance solid silver, may retain its particulate structure. Pads 401 and 402 may include an occasional void. Range of pad thickness 142 is between 1 and 7 μm.

Figure 5:
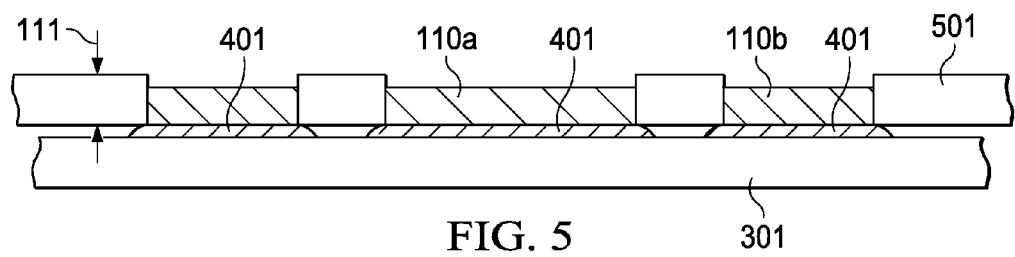

In the next process step, shown in FIG. 5, a mask 501 is aligned with the first pads 401 and second pads 402 of sintered nano-particles of bondable and solderable metal (preferably silver, as stated above). When screen printing or stencil printing are used as deposition techniques, the mask comes with the technique. A paste is then deposited on the pads 401 and 402 of sintered nano-particles, wherein the paste includes a mixture of micrometer-sized metal particles (so-called micro-particles) and nanometer-sized metal particles (so-called nano-particles). A mixture of these metal particles of widely different sizes is sometimes referred to as a hybrid mixture. The metal needs to have good electrical conductivity and is selected from a group including copper, silver, zinc, nickel, indium, cadmium, cobalt, rhodium, high-temperature solders, and metal-filled adhesives; the preferred choice is copper. The thickness 111 of the deposited layer is between 20 and 200 μm, preferably between about 40 and 60 μm. Using the earlier designations, the hybrid layers on pads 401 are designated 110b, and the hybrid layer on pad 402 is designated 110a. After deposition, the mask is removed. The method of depositing is selected from a group including stencil printing, screen printing, and inkjetting; the preferred method for this step is screen printing.

After mask removal, the metal hybrid particles, for example copper hybrid particles, are sintered at a temperature below the melting temperature of the metal used, preferably between about 250 and 400° C. for about 30 to 60 min. The resulting sintered pads are solid metal, for instance solid copper, with an agglomerate structure. Pads 401 and 402 may include occasional voids. In general, higher sintering temperatures will result in fewer voids. The voids do not form continuous paths so that molding compound (see below) cannot reach the interface with silver layer 402.

Figure 6:
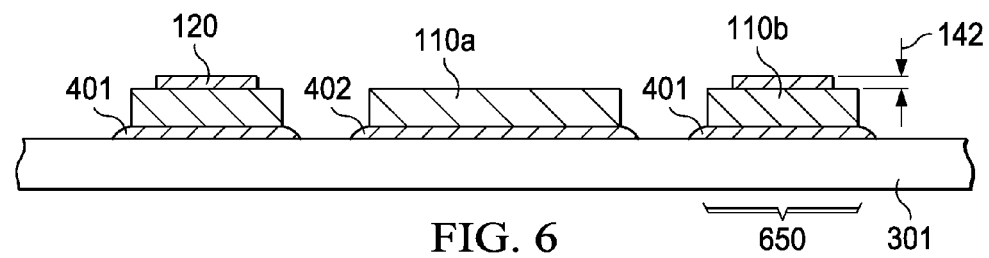

FIG. 6 illustrates the next process step. A third patterned metal stripe 120, with thickness 142, is deposited on the agglomerate layers 110b. The lateral extensions of layers 120 nearly cover the top of pads 110b. The preferred deposited material is a paste of metal nano-particles mixed in a liquid. The metal needs to be bondable and solderable and is selected from a group including silver, gold, nickel, and palladium; the preferred metal is silver. The method of depositing is selected from a group including inkjetting, stencil printing, and screen printing; the preferred method for this step is inkjetting.

After the deposition, the metal nano-particles, for example silver nano-particles, are sintered at a temperature between about 250 and 400° C. for about 30 to 60 min. The resulting sintered pad is solid metal, for instance solid silver, and may retain its particulate structure. Pads 120 may include an occasional small void. Range of pad thickness 142 is preferably between 1 and 7 μm. As FIG. 6 illustrates, the resulting vertical stack 650 of metal layers has the agglomerate stripe 110a (for instance copper) like a sandwich between two thinner particulate stripes 120 and 401 of bondable and solderable metal (for instance silver).

Figure 7:
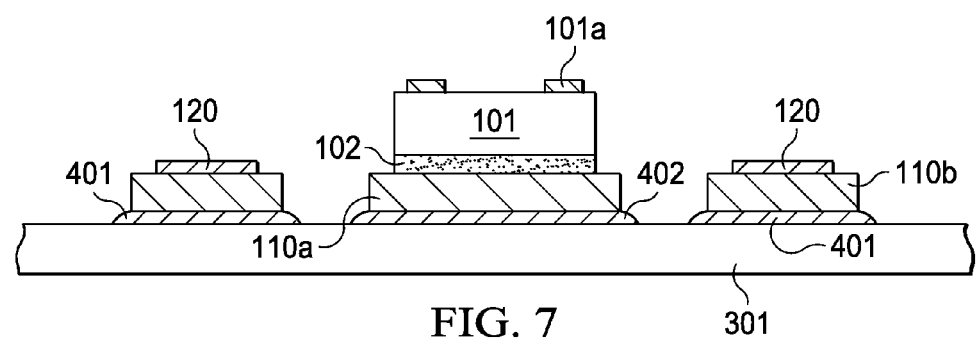

In the next process step, depicted in FIG. 7, a semiconductor chip 101 with terminals (bond pads) 101a is adhesively attached to the agglomerate metal layer 110a (for example copper) by using, for instance, a layer 102 of uncured epoxy or an adhesive film still adjoining the chip from the wafer sawing step. Alternatively, the chip attach layer may be selected to be electrically and thermally conductive, such as solder. Thereafter, the chip attach compound 102 may be cured (polymerized) at a temperature between about 150 and 250° C.

Figure 8:
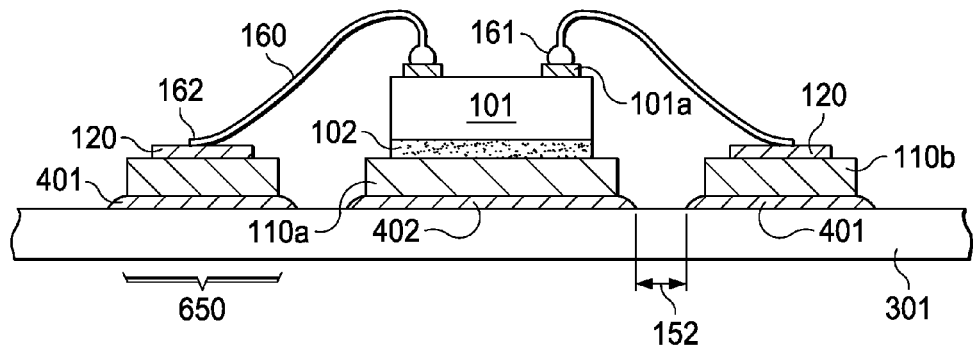

FIG. 8 illustrates the next process step: The spanning of bonding wires 160 from the chip terminals 101a to the second layers 120 of bondable and solderable metal, positioned as the top layers of the stack 650 of first pads. Preferred bonding wires are made of copper; alternative choices include gold and aluminum. The wires 160 arch across gaps 152 between first pads 401 and second pads 402. When a ball bonding technique is used, ball 161 is preferably attached to chip terminal 101a and stitch 162 to layer 120. An alternative bonding process forms balls on both chip terminal 101a and layer 120 with the wire stitch on either chip terminal 101a or layer 120. When a wedge bonding technique is used, layer 120 again has a stitch bond. Typical bonding temperatures are between about 100 and 250° C. Alternatively, when flip-chip bonding is used, the metal bump (for instance solder) is selected to facilitate strong connection to layers with particulate or agglomerate structure.

Figure 9:
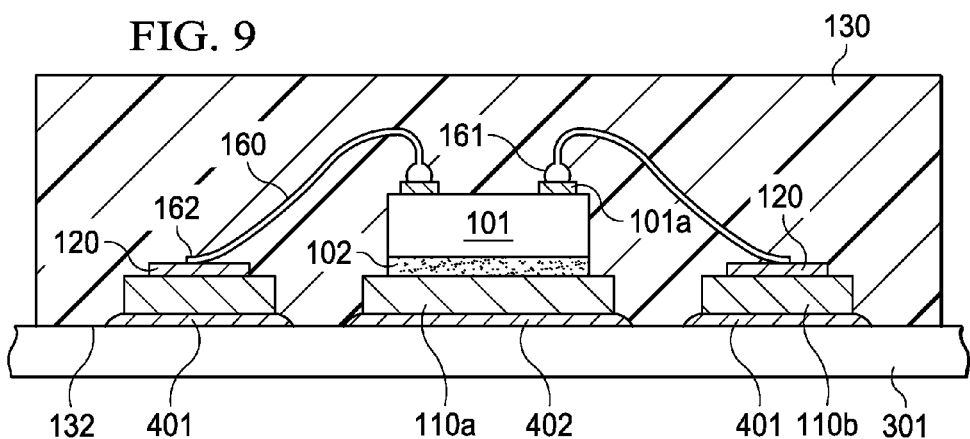

In the next process step, shown in FIG. 9, chip 101 and bonding wires 160 are encapsulated in a polymeric compound 130. Concurrently, this process step fills the gaps 152 between first pads 401 and second pads 402 and creates surface 132 of the compound on carrier 301. The encapsulation step can be performed either on individual strips of the reusable carrier, or in reel-to-reel form if the assembly is set up for reel-to-reel processing. The preferred encapsulation technology is a transfer molding technique involving temperatures of about 170 to 180° C. The preferred thermoset compounds need polymerization (hardening) for several hours at 150 to 200° C. Alternatively, the molding compound may be a quick cure compound, either epoxy or thermoplastic. After hardening the compound, the device package keeps its cuboid outline.

Figure 10:
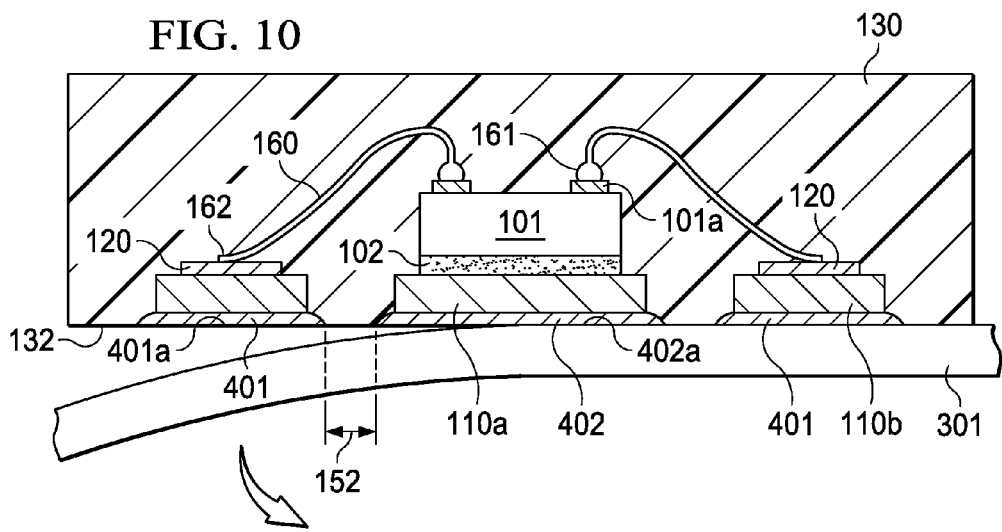

After the encapsulation compound 130 is hardened, the assembly actualizes the process step displayed in FIG. 10, separating carrier 301 from the surfaces 401a and 4-2a of first layers (pads) 401 and 402, respectively, and from the hardened compound 130 in the gaps 152 between the pads. This step of removing the carrier may be executed by techniques of peeling, pushing, or twisting carrier 301 with respect to the encapsulated assembly. As an example, FIG. 10 illustrates the technique of peeling carrier 301. After lift-off, carrier 301 may be ready for subsequent re-use. The process step of removing the carrier exposes the metal surfaces 401a and 402a of the sintered solid metal stripes 401 and 402. After separation, the re-usable carrier may need a conditioning step such as cleaning or application of a mold release compound before it is being recycled to the beginning of the process flow.

Surfaces 401a and 402a can be electrically connected by pressure contact to external parts, as often preferred for leadless packages, or they can be subjected to the next process step of soldering, as applicable for ball-grid array type packages. Using an electrolytic solder plating technique or an electroless process, as is practiced for nickel, palladium and gold, a coat of solder is applied. Alternatively, a solder paste can be screened onto the pads. The solder coat is then heated to the solder reflow temperature, preferably between about 200 and 260° C., dependent on the selected solder alloy. When the solder is liquid, it dissolves the solderable metal of layers 401 and 402; when this metal is silver, it is fully dissolved by the solder alloy so that the alloy mixed with the silver can reliably wet and interlock with the agglomerate metal of pads 110a and 110b. By the dissolution of silver, any risk of silver migration is eliminated. When pads 110a and 110b are made of agglomerate copper, a small amount of copper may also be dissolved in solder, enhancing the reliable contact of pads 110*a* and 110*b* to solder. Reliable solder joints to package terminals with aggregate metal structure are thus established.

For reasons of economic efficiency, the fabrication process flow outlined in FIGS. 3 to 10 is preferably executed by selecting the carrier in strip form so that a plurality of chips can be processed concurrently. In this case, the strip with the hardened polymeric encapsulation resembles a stiff board which retains this characteristic after removing the carrier. In this case, the last step of the process flow includes the step of sawing the hardened board in order to singulate each chip, assembled on second pad 151 and surrounded by its respective set of first pads 150, as an encapsulated semiconductor device 100. The preferred method of singulation is sawing. It may be mentioned that in the step of sawing, the blade can run solely through hardened plastic material since, in contrast to conventional semiconductor devices, device 100 does not include a metallic leadframe.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to semiconductor products with packaged single chips, but also to products with multi-chips or stacked chips.

As another example, the invention applies to packages, in which the first and the second terminals are sintered from pastes with particles so that both have agglomerate structure, and in which the first and the second terminals are sintered from pastes with particles so that both have particulate structure.

As yet another example, the invention applies to packages, in which the semiconductor chip is attached by a flip-chip technique to sintered stripes of bondable and solderable metal.

It is therefore intended that the appended claims encompass any such modifications or embodiments.

We claim:

1. A semiconductor device comprising:
a cuboid plastic package, one side of the package having first terminals surrounding a second terminal, the first terminals spaced by gaps from the second terminal;
the first terminals including a solid copper stripe having an agglomerate structure, an external surface welded to a coat of solder mixed with silver, and an internal surface touching a layer of silver having a particulate structure; and
the second terminal including a layer of copper having an agglomerate structure, an external surface welded to a coat of solder mixed with silver, and an internal surface to which a semiconductor chip is adhesively attached.

2. The device of claim 1 further comprising:
wires bonding the semiconductor chip to the layers of sintered silver nano-particles of the first terminals; and
polymeric compound encapsulating chip and wires and filling the gaps between first and second terminals.

\* \* \* \* \*